(12) United States Patent
Hamada et al.

(10) Patent No.: US 9,560,743 B2
(45) Date of Patent: Jan. 31, 2017

(54) MULTILAYER CIRCUIT SUBSTRATE HAVING CORE LAYER WITH THROUGH-HOLE

(71) Applicant: TAIYO YUDEN CO., LTD., Tokyo (JP)

(72) Inventors: Yoshiki Hamada, Tokyo (JP); Yuichi Sugiyama, Tokyo (JP); Akihiro Hoshino, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 160 days.

(21) Appl. No.: 13/872,381

(22) Filed: Apr. 29, 2013

(65) Prior Publication Data

US 2014/0144692 A1 May 29, 2014

(30) Foreign Application Priority Data

Nov. 27, 2012 (JP) .................................. 2012-258295

(51) Int. Cl.
*H05K 1/11* (2006.01)
*H05K 1/02* (2006.01)
*H05K 1/18* (2006.01)

(52) U.S. Cl.
CPC ............ *H05K 1/0253* (2013.01); *H05K 1/0225* (2013.01); *H05K 1/0228* (2013.01); *H05K 1/185* (2013.01); *H05K 2201/0979* (2013.01); *H05K 2201/09236* (2013.01)

(58) Field of Classification Search
CPC .. H05K 1/0253; H05K 1/0225; H05K 1/0228; H05K 1/185; H05K 2201/09236; H05K 2201/0979
USPC ................ 174/262, 250, 251, 253, 255–258
See application file for complete search history.

(56) References Cited

U.S. PATENT DOCUMENTS

| 8,735,732 B2 * | 5/2014 | Saji et al. ...................... 174/255 |
| 2003/0058630 A1 * | 3/2003 | Takano et al. ................. 361/783 |
| 2004/0100731 A1 * | 5/2004 | Sato ....................... B82Y 10/00 360/123.61 |
| 2004/0179344 A1 * | 9/2004 | Uchida et al. ................ 361/777 |
| 2007/0080447 A1 * | 4/2007 | Hasebe ................ H01L 23/142 257/706 |
| 2009/0084596 A1 | 4/2009 | Inoue et al. |
| 2009/0229866 A1 * | 9/2009 | Oyamada ..................... 174/255 |

FOREIGN PATENT DOCUMENTS

JP          2009-81423 A       4/2009

* cited by examiner

*Primary Examiner* — Tremesha S Willis
(74) *Attorney, Agent, or Firm* — Chen Yoshimura LLP

(57) ABSTRACT

A multilayer circuit substrate obtained by alternately stacking conductor layers and insulator layers. The conductor layers include a core layer having a greater thickness than any of the other conductor layers and located in an inner layer of the multilayer circuit substrate. A first conductor layer facing the core layer through an insulator layer has first signal wires that transmit high frequency signals, and through-holes are formed in the core layer along the first signal wires in a location facing the first signal wires.

11 Claims, 4 Drawing Sheets

MULTILAYER CIRCUIT SUBSTRATE HAVING CORE LAYER WITH THROUGH-HOLE

This application claims the benefit of Japanese Application No. 2012-258295, filed in Japan on Nov. 27, 2012, which is hereby incorporated by reference in its entirety.

BACKGROUND OF THE INVENTION

1. Field of the Invention

The present invention relates to a multilayer circuit substrate obtained by alternately stacking conductor layers and insulator layers, and more particularly, relates to a structure suitable for transmission of high frequency signals.

2. Description of Related Art

Mobile phones and other electronic devices are examples of usages of this type of multilayer circuit substrate. However, recently there has been demand for thinner and denser multilayer circuit substrates following the demand for smaller electronic devices with more functions. In order to respond to this demand there has been an emergence of component embedded circuit substrates in which various types of electronic components such as capacitors are embedded into a multilayer circuit substrate (see Patent Document 1). Patent Document 1 discloses a multilayer circuit substrate having a conductor layer formed of metal thicker than the other conductor layers and arranged in the inner layer thereof as the core layer to improve noise resistance and strength of electronic components. The electronic components are arranged in through-holes formed in the core layer. Furthermore, conductor layers and insulator layers are formed on the top surface and bottom surface of the core layer.

RELATED ART DOCUMENT

Patent Document

Patent Document 1: Japanese Patent Application Laid-Open Publication No. 2009-81423

SUMMARY OF THE INVENTION

However, the structure disclosed in Patent Document 1 had trouble sufficiently responding to the recent demands for thinner and denser multilayer circuit substrates. Specifically, the thickness of the insulator layer needs to be reduced for the multilayer circuit substrate to be made thinner, but the structure disclosed in Patent Document 1 has a problem in which the characteristic impedance of the high frequency signal transmission line changes when the insulator layer is merely made thinner. This problem is particularly marked when signal wires are arranged on a conductor layer facing the core layer through an insulator layer. In order to fix this it is possible to secure the thickness of the insulator layers by reducing the number of layers on the multilayer circuit substrate, but this method makes it difficult to increase the density because the total area for possible circuit pattern formation is reduced. Alternatively, it is also possible to change the permittivity of the insulator layer, but this leads to an increase in cost.

The present invention was made in view of the above-mentioned problems, and aims at providing a multilayer circuit substrate that can be made thinner and denser with ease and that is suitable for high frequency circuits.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a multilayer circuit substrate obtained by alternately stacking insulator layers and conductor layers, wherein the conductor layers include a core layer having a greater thickness than any of other conductor layers and located in an inner layer of the multilayer circuit substrate, wherein a first conductor layer facing the core layer through an insulator layer has a first signal wire that transmits high frequency signals, and wherein a through-hole is formed in the core layer along the first signal line in a location facing the first signal wire.

According to the present invention, the through-hole is formed along the first signal wire in a core layer facing the first signal wire through an insulator layer, and therefore, the effect on the characteristic impedance of the first signal wire by the core layer can be kept small. Thus, it is possible to achieve a thinner and denser multilayer circuit substrate while maintaining desired high frequency characteristics.

In one preferred embodiment of the present invention, a second conductor layer facing the first conductor layer through an insulator layer has a ground conductor formed in a region facing part or all of the first signal wire. According to the present invention, the characteristic impedance of the first signal wire can be defined by the form of the ground conductor of the second conductor layer and the insulator layer interposed between the ground conductor and the first signal wire.

In another preferred embodiment of the present invention, the first conductor layer has a ground conductor on both sides of the first signal wire so as to have a prescribed distance with respect to the first signal wire. According to the present invention, the characteristic impedance of the first signal wire can be defined by the form of the ground conductor. In another preferred embodiment of the present invention, in a plan view, a distance from a center line of the first signal wire to an edge of the through hole in a width direction is greater than a distance from a center line of the first signal wire to an edge thereof in a width direction.

In another preferred embodiment of the present invention, a plurality of through-holes are formed in the core layer along the first signal wire. According to the present invention, the strength of the core layer can be secured. In this case, the third conductor layer that faces the core layer through an insulator layer on the opposite side to the first conductor layer has a second signal wire that transmits high frequency signals, and in a plan view, the second signal wire is formed such that the second signal wire intersects with the first signal wire, and such that the intersection is located between adjacent through-holes. This way, the core layer is present where the second signal wire and the first signal wire intersect, and therefore, interference between both signal wires can be suppressed.

As described above, a multilayer circuit substrate according to the present invention can be made thinner and denser while maintaining desired high frequency characteristics.

DETAILED DESCRIPTION OF THE
PREFERRED EMBODIMENTS

Figure 1:
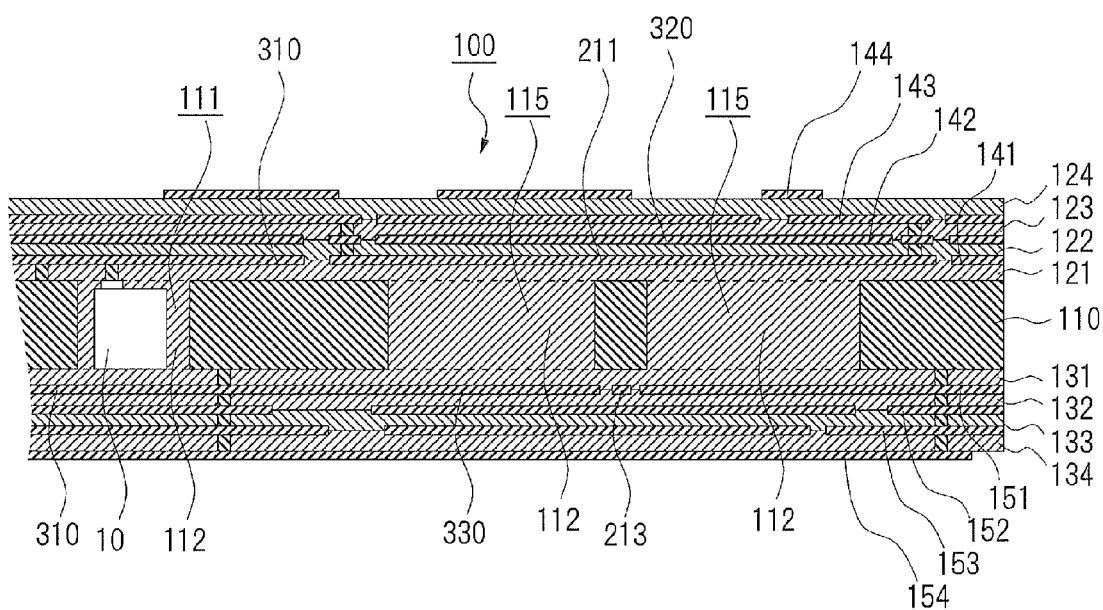
FIG. 1 is a cross-sectional view of a part of the multilayer circuit substrate.

A multilayer circuit substrate according to one embodiment of the present invention will be explained with reference to the figures. In the present embodiment, the multilayer circuit substrate used in high frequency circuit modules and configured as an embedded component board in which electronic components are embedded will be explained. FIG. 1 is a cross-sectional view of a part of the multilayer circuit substrate. In the present embodiment, in order to have a simpler explanation mainly the structures relating to the gist of the present invention will be explained.

A multilayer circuit substrate 100 is a multilayer board obtained by alternately stacking insulator layers and conductor layers. As shown in FIG. 1, the multilayer circuit substrate 100 is equipped with: a core layer 110 that is a conductor layer made of relatively thick metal with good conductive properties; a plurality (4 in this embodiment) of insulator layers 121-124 and conductor layers 141-144 formed on one principal surface (the upper surface) of the core layer 110; and a plurality (4 in this embodiment) of insulator layers 131-134 and conductor layers 151-154 formed on the other principal surface (the lower surface) of the core layer 110. The insulator layers 121-124, 131-134 and the conductor layers 141-144, 151-154 are formed on both principal surfaces of the core layer 110 by a build-up method. The insulator layers 121-124, 131-134 are formed of a synthetic resin (not only thermosetting resin, but also thermoplastic resin can be used) such as an epoxy resin, a polyimide, a bismaleimide triazine resin, or a material obtained by adding a reinforcing filler such as glass fiber to any of these resins, and the thickness of the insulator layers 121-124, 131-134 is for example within the range of 10-30 µm. Furthermore, the conductor layers 141-144, 151-154 are made of a metal such as copper and copper alloy, and the thickness is for example within the range of 5-25 µm. As discussed later, via conductors are sometimes arranged in the conductor layers 141-144, 151-154, and the via conductors are formed of a metal such as copper and copper alloy, and the diameter is for example within the range of 10-80 µm. The conductor layers 144 and 154 correspond to surface layers of the multilayer circuit substrate 100. The conductor layer 144 corresponds to a component mounting surface of a high frequency circuit module, where a circuit pattern that transmits high frequency signals, a land for mounting an external part, an inspection pad, and the like are formed. The conductor layer 154 corresponds to a bottom surface where the high frequency circuit module is mounted on a parent circuit substrate, and where a terminal electrode, a ground electrode, and the like are formed.

A first through-hole 111 for storing an electronic component is formed in the core layer 110. Arranged in the first through-hole 111 is for example an electronic component 10, such as an acoustic wave filter or a laminated ceramic capacitor, used in high frequency circuits. Therefore the core layer 110 is preferably of a greater thickness than the height of the part to be embedded and has a better flexural strength. The core layer 110 is formed of a conductive material and is provided with an electric reference potential (ground). The core layer 110 is one of the conductor layers of the multilayer circuit substrate 100. In the present embodiment, the core layer 110 is formed of a metal plate, more specifically a metal plate made of copper or copper alloy. The thickness of the core layer 110 is for example within the range of 100-400 µm. An insulator 112 such as a resin is filled into the space around the stored component in the first through-hole 111. Furthermore, there is a plurality of second through-holes 115 formed in the core layer 110 along the signal wires in a location opposing signal wires discussed later formed in the conductor layer 141. The insulator 112 such as a resin is filled into the second through-holes 115 in a manner similar to the first through-hole 111. The shape, arrangement, and the like of the second through-holes 115 will be discussed later.

Next, a mounting structure of the signal wires in the multilayer circuit substrate 100 will be explained. FIGS. 2A to 2D show patterns in the respective layers that explains the main parts of the multilayer circuit substrate. FIG. 2A to 2D show the conductor layer 151, the core layer 110 of multilayer circuit substrate 100, the conductor layer 141, and the conductor layer 142 in this order when viewed from a component mounting surface side (the top side of FIG. 2) of the multilayer circuit substrate 100. FIG. 1 discussed earlier is a cross-sectional view along the arrow A in FIG. 2A.

Figure 2A:
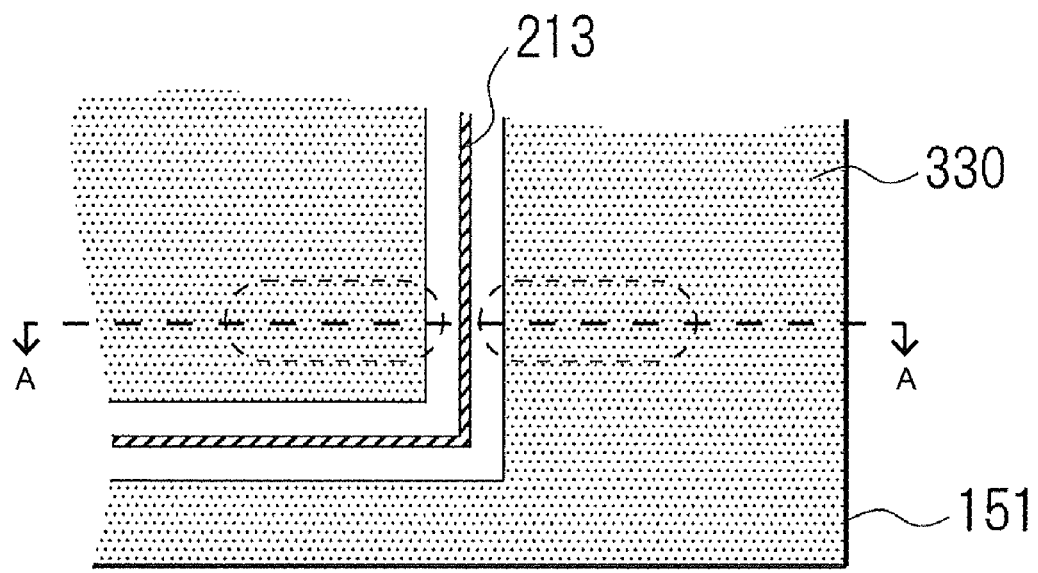
FIGS. 2A to 2D are diagrams showing patterns of respective layers illustrating the main parts of the multilayer circuit substrate.
Figure 2B:
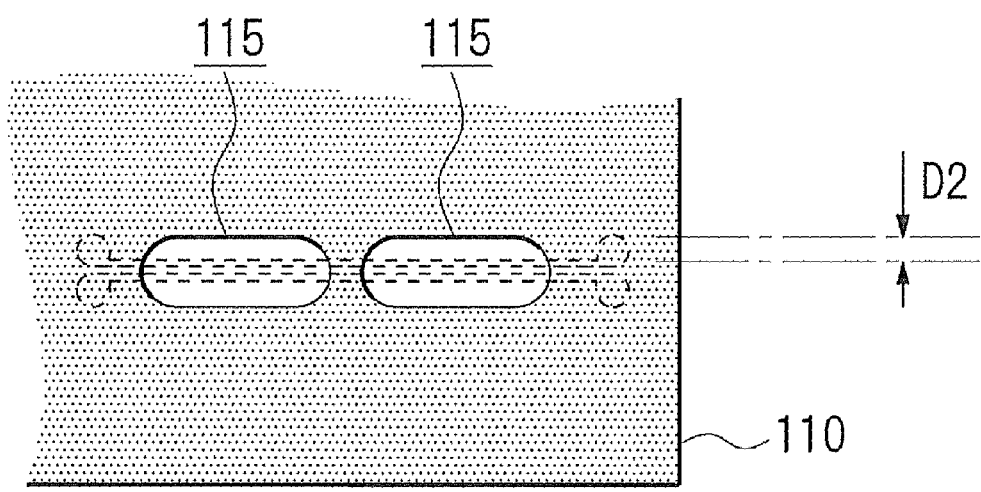
Figure 2C:
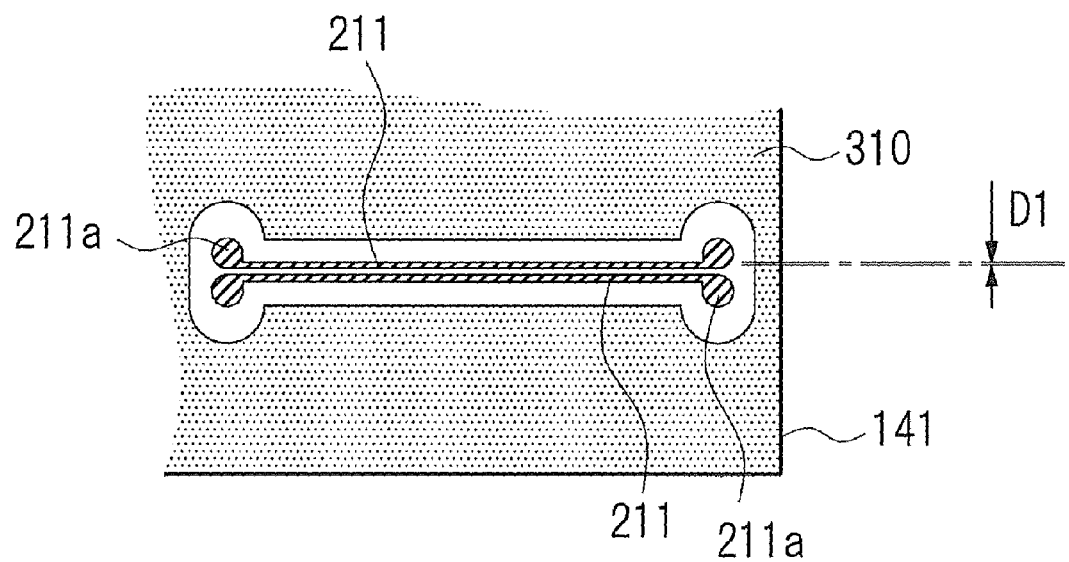

As shown in FIG. 2C, first signal wires 211 that are transmission lines of high frequency signals are formed on the first conductor layer 141 facing the core layer 110 through the insulator layer 121. In the present embodiment, in order to transmit balanced high frequency signals, a pair of first signal wires 211 running parallel to each other are formed on the first conductor layer 141. The width of the first signal wires 211 is within the range of 10-150 µm, for example, and was 30 µm in the present embodiment. Lands 211a for via connection are formed on terminals of the first signal wires 211. The first conductor layer 141 includes a ground conductor 310 formed therein. The ground conductor 310 is provided on both sides (the width direction of the first signal wires 211) of the first signal wires 211 at a prescribed distance with respect to the first signal wires 211. The ground conductor 310 is connected to the core layer 110 through a via conductor. In the present embodiment, as discussed later, in order to have the first signal wires 211 function as a micro-strip line, it is preferable for the distance between the first signal wires 211 and the ground conductor 310 to be far enough apart that the characteristic impedance of the first signal wires 211 is not affected, for example, within the range of 10-30 µm. In the present embodiment, the distance between the first signal wires 211 and the ground conductor 310 was 15 µm.

As shown in FIG. 2B, second through-holes 115 are formed in the core layer 110 along the first signal wires 211 in a position opposing the first signal wires 211. The second through-holes 115 are formed in a long hole shape along the extending direction of the first signal wires 211, and the lengthwise terminal thereof is formed in a circular arc shape. In the present embodiment, a plurality of second-through holes 115 are formed along the first signal wires 211. Thus, even if the first signal wires 211 are long, the strength of the core layer 110 can be secured.

Figure 2D:
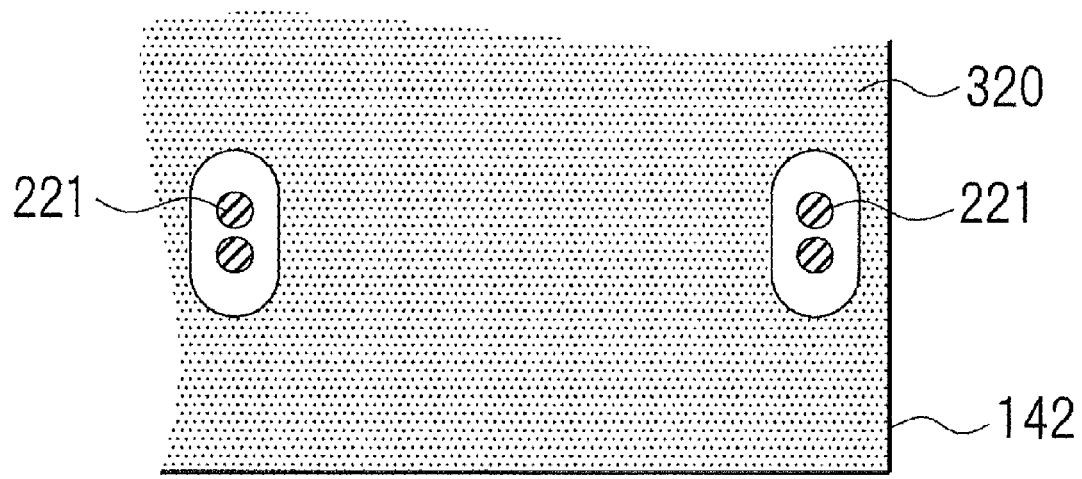

As shown in FIG. 2D, a ground conductor 320 is formed in the second conductor layer 142 facing the first conductor layer 141 through the insulator layer 122 at least at a location opposing the first signal wires 211. The ground conductor 320 constitutes the ground of a micro-strip line in relation to the first signal wires 211. The ground conductor 320 is connected to the ground conductor 310 of the first conductor layer 141 through a via conductor. Lands 221 for via connection with the first signal wires 211 are formed in the second conductor layer 142.

With the configuration described above, the characteristic impedance of the first signal wires 211 has very low influence from the core layer 110 and can be determined by the wire width of the first signal wires 211, the thickness of the insulator layer 122 (that is, the distance between the first signal wires 211 and the ground conductor 320), the permittivity, and the like. In other words, it is possible to suppress the influence of the thickness of the insulator layer 121, and therefore, the thickness reduction and density improvement can be achieved with ease.

Figure 3:
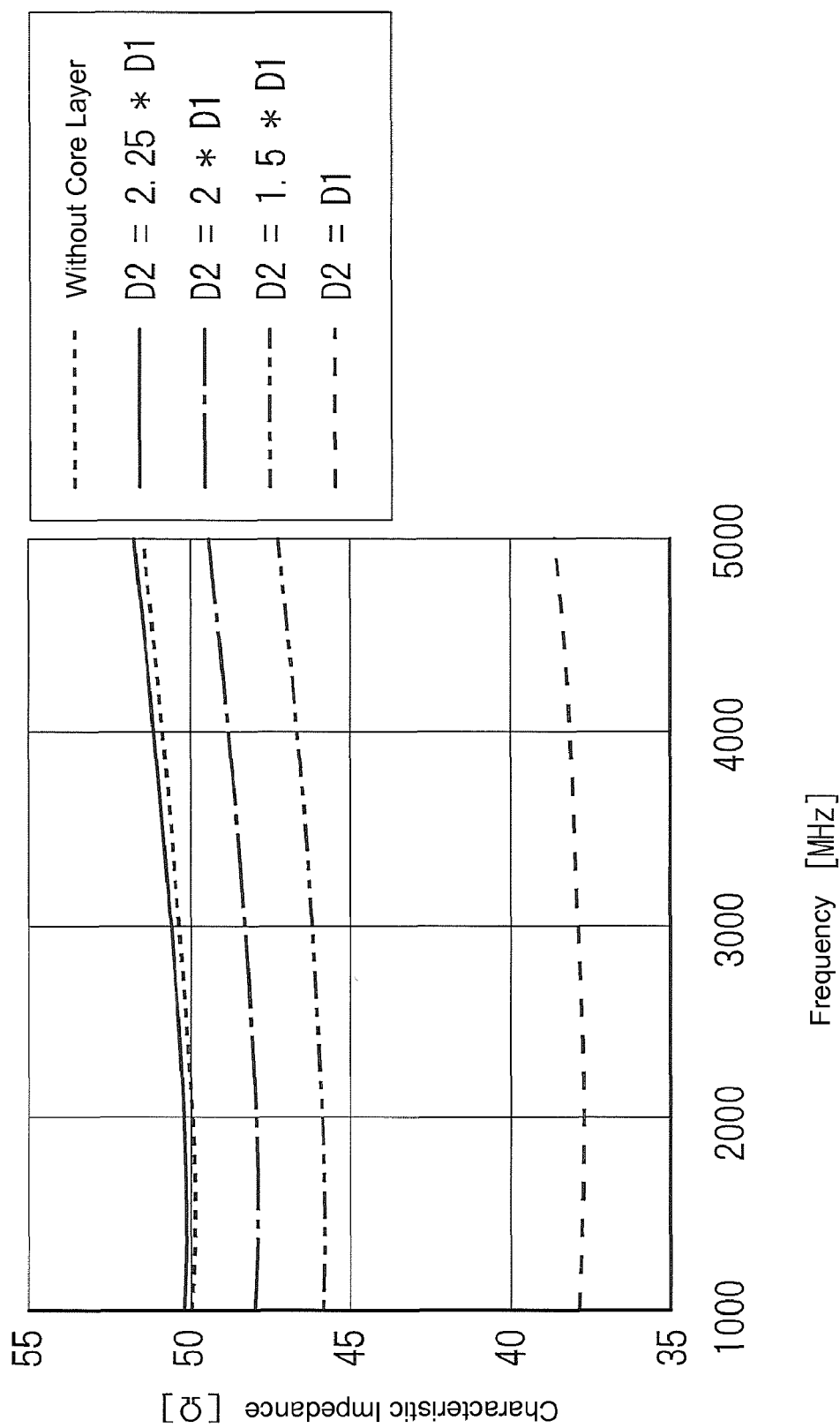
FIG. 3 is a graph that shows the relationship between the second through-holes and the characteristic impedance.

In the above-mentioned configuration, it is preferable to secure the width of the second through-holes 115 sufficiently enough to suppress the influence on the characteristic impedance on the first signal wires 211. More specifically, if D1 is the distance from a center line of each first signal wire 211 to the edge thereof in the width-direction (½ of the width of each first signal wire 211), and if D2 is the distance from a center line of each first signal wire 211 to the edge of the second through-holes 115 in the width direction when the first signal wires 211 are projected, then it is preferable to make the distance D2 greater than the distance D1. FIG. 3 shows a graph of the characteristic impedance of the first signal wires 211 when the width of the second through-holes 115 is changed. FIG. 3 is the result of changing the distance D2, and conducting an analysis with a three-dimensional electromagnetic field simulation by the finite element method. The permittivity 3.5@1 GHz of the epoxy resin including a filler being used in the present embodiment was adopted for the permittivity of the insulator used in this analysis. As a comparison example, another analysis was conducted on the state in which the core layer 110 is not provided, which is an ideal state from the viewpoint of the characteristic impedance. As is apparent from FIG. 3, the greater the distance D2 is made, the more the electric field coupling with the first signal wires 211 and the core layer 110 is suppressed, and effectively moves closer to an ideal characteristic impedance. As shown in FIG. 3, distance D2, which is the distance from a center line of each first signal wire 211 to the edge of the second through-holes 115 in the width direction when the first signal wires 211 are projected, is greater than distance D1, which is the distance from a center line of each first signal wires 211 to the edge thereof in the width direction, and is preferably 1.5 times or greater with respect to distance D1, and even more preferably is 2.25 times or greater with respect to distance D1.

Furthermore, it is preferable to set the number of the plurality of second through-holes 115 and the spacing between the respective second though-holes 115 so as to secure sufficient strength of the core layer 110. Thus, these values may be determined based on the material and thickness of the core layer 110, the length and the shape (straight, curved, or the like) of the first signal wires 211, the length and width of the second through-holes 115, or the like. For example, when the second through-hole 115 is at or below a prescribed length, there may be only one second through-hole 115, whereas when exceeding a prescribed length, the second through-hole 115 may be formed by being divided into a plurality of holes. As a more specific example, in the present embodiment, it is preferable to form the second through-holes 115 by dividing them into a plurality of holes when the thickness of the core layer 110 is 340 mm and the length of the second through-holes 115 exceeds 9.5 mm. In this case, it is preferable for the spacing between the adjacent plurality of second through-holes 115 to be 0.05 mm or greater.

As shown in FIG. 2A, a second signal wire 213 that is a transmission path for high frequency signals is formed in the third conductor layer 151 facing the core layer 110 through the insulator layer 131. The second signal wire 213 is formed so as to intersect with the first signal wires 211 when projected in the thickness direction of the multilayer circuit substrate 100. The intersection of the first signal wires 211 and the second signal wire 213 is arranged between the plurality of second through-holes 115. Thus, the core layer 110 is interposed between the first signal wires 211 and the second signal wire 213, and therefore, interference between both signal wires can be suppressed to a minimum. A ground conductor 330 is formed in the third conductor layer 151 at a prescribed distance from the second signal wire 213. The ground conductor 330 is connected with the core layer 110 through a via conductor.

According to the multilayer circuit substrate 100 of the present embodiment as described above, second through-holes 115 are formed in the core layer 110 in a location facing the first signal wires 211, and therefore, the influence of the core layer 110 on the characteristic impedance of the first signal wires 211 can be suppressed to a minimum. Thus, it is possible to achieve a thinner and denser multilayer circuit substrate 100 while maintaining desired high frequency characteristics.

The above has described in detail embodiment of the present invention, but the present invention is not limited to this. For example, the above-mentioned embodiment illustrated balanced transmission by a pair of first signal wires 211, but the first signal wires 211 may also be one wire or may be three or more wires.

Furthermore, in the above-mentioned embodiment, a micro-strip line was constituted by first signal wires 211 and the ground conductor 320 formed on the second conductor layer 142 facing the first signal wires 211. Therefore, the distance between the ground conductor 310 formed in the same layer as the first signal wires 211 and the first signal wires 211 was made sufficiently large. The present invention may also constitute a co-planar line by the first signal wires 211 and the ground conductor 310. In this case, the distance between the first signal wires 211 and the ground conductor 310 formed in the same layer as the first signal wires 211 may be appropriately set so as to obtain the desired characteristic impedance. Furthermore, in this case, the ground conductor 320 formed in the second conductor layer 142 facing the first signal wires 211 may be removed as needed, or a cut-out pattern may be formed on a region (and a peripheral region thereof) facing the first signal wires 211.

In the above-mentioned embodiment, the first through-hole 111 was formed in the core layer 110, and an electronic component such as a filter was arranged in the through-hole 111, but a recess may also be formed instead of a through-hole in the core layer 110, and an electronic component may be arranged in the recess.

The multilayer circuit substrate 100 according to the above-mentioned embodiment is used as a high frequency circuit module by mounting an electronic component on a land and the like formed on the conductor layer 144, but it is preferable to further attach a case so as to cover all or part of the upper surface of the multilayer circuit substrate 100, or to seal with a resin or the like.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A multilayer circuit substrate obtained by alternately stacking insulator layers and conductor layers,
   wherein the conductor layers contain a core layer having a greater thickness than any of other conductor layers and located in an inner layer of the multilayer circuit substrate,
   wherein a first conductor layer facing the core layer through an insulator layer has a first signal wire that transmits high frequency signals,
   wherein a through-hole is formed in the core layer along the first signal wire in a location facing the first signal wire,
   wherein the through-hole is formed in a long hole shape elongated along an extending direction of the first signal wire as seen in a plan view, and an entirety of said through-hole is filled with an insulator.

2. The multilayer circuit substrate according to claim 1, wherein a second conductor layer facing the first conductor layer through an insulator layer has a ground conductor formed in a region facing part or all of the first signal wire.

3. The multilayer circuit substrate according to claim 1, wherein the first conductor layer has a ground conductor on both sides of the first signal wire so as to have a prescribed distance with respect to the first signal wire.

4. The multilayer circuit substrate according to claim 1, wherein, in a plan view, a distance from a center line of said first signal wire to an edge of the through hole in a width direction is greater than a distance from a center line of the first signal wire to an edge thereof in a width direction.

5. The multilayer circuit substrate according to claim 1, wherein a plurality of through-holes are formed in the core layer along the first signal wire.

6. The multilayer circuit substrate according to claim 5, wherein a third conductor layer facing the core layer through an insulating layer on a side opposite to the first conductor layer has a second signal wire that transmits high frequency signals, and
   wherein, in a plan view, said second signal wire intersects with the first signal wire, and an intersection thereof is located between adjacent through-holes.

7. The multilayer circuit substrate according to claim 1, wherein the first signal wire comprises a pair of signal wires running parallel to each other.

8. A high frequency circuit module, comprising:
   the multilayer circuit substrate according to claim 1; and
   an electronic component mounted on the multilayer circuit substrate.

9. The multilayer circuit substrate according to claim 1, wherein a lengthwise terminal of the through-hole is formed in a circular arc shape.

10. The multilayer circuit substrate according to claim 1, wherein the core layer includes another through-hole in which an electronic component is mounted.

11. The multilayer circuit substrate according to claim 10, wherein said another through-hole is filled with an insulator.

* * * * *